United States Patent

Walczak et al.

[11] Patent Number: 5,621,763
[45] Date of Patent: Apr. 15, 1997

[54] APPARATUS AND METHOD FOR GENERATING A TRANSITION BETWEEN THE ON AND OFF STATES OF A RADIO FREQUENCY TRANSMITTER

[75] Inventors: Thomas J. Walczak, Woodstock; Robert I. Greene, Streamwood; Stephen V. Cahill, Palatine; John W. Diehl, Glen Ellyn, all of Ill.

[73] Assignee: Motorola, Schaumburg, Ill.

[21] Appl. No.: 440,854

[22] Filed: May 15, 1995

Related U.S. Application Data

[63] Continuation of Ser. No. 154,680, Nov. 18, 1993, abandoned, which is a continuation of Ser. No. 733,494, Jul. 22, 1991, abandoned.

[51] Int. Cl.$^6$ ................................................. H04L 27/04
[52] U.S. Cl. ............................................ 375/312; 375/229
[58] Field of Search .................................. 375/309, 312, 375/313, 295, 296, 229; 332/155, 158; 330/279, 127; 455/116; 178/116

[56] References Cited

U.S. PATENT DOCUMENTS 2,089,781  8/1937  Buschbeck .................... 375/72 X
4,485,478 11/1984  Takada ......................... 375/68 X
4,706,243 11/1987  Noguchi ...................... 455/116 X

OTHER PUBLICATIONS

"Technical Terms" 2nd edition, Daniel Lapedes p. 1322, 1978.

Primary Examiner—Tesfaldet Bocure
Attorney, Agent, or Firm—Kevin D. Kaschke

[57] ABSTRACT

An apparatus and method generates a shaped transition between the minimum and maximum output power levels of a transmitter (500). When the transmitter is turned on a stepped transition (415) is generated at the beginning (3) of the transition region (409) followed by a shaped transition (417) to the end (6) of the transition region (409). When the transmitter (500) is turned off a shaped transition region (417') is generated at the beginning (162) of the transition region (411) followed by a stepped transition (415') at the end (3) of the transition region (411). The stepped transition (415 or 415') is generated by adjusting a voltage controlled attenuator (545) and the bias of a power amplifier (545) in the transmitter (500). The shaped transition (417 or 417') is generated by processing transmitted information through finite impulse response filters (507 or 509) before or after the time slot permitted for transmitting information.

12 Claims, 4 Drawing Sheets

APPARATUS AND METHOD FOR GENERATING A TRANSITION BETWEEN THE ON AND OFF STATES OF A RADIO FREQUENCY TRANSMITTER

RELATED APPLICATION

This is a continuation of application Ser. No. 08/154,680, filed Nov. 18, 1993 and now abandoned which is a continuation of application Ser. No. 07/733,494, filed Jul. 22, 1991 and now abandoned.

This application is related to the instant assignee's copending application Ser. No. 07/632,231, filed Dec. 20, 1990, invented by Thomas J. Walczak and Stephen V. Cahill, and entitled, "Power Control Circuitry for a TDMA Radio Frequency Transmitter".

FIELD OF THE INVENTION

The present invention relates generally to communications equipment, and more particularly to an apparatus and method for generating a transition between the on and off states of a radio frequency (RF) transmitter without producing undesirable spectral components.

BACKGROUND OF THE INVENTION

Figure 1:
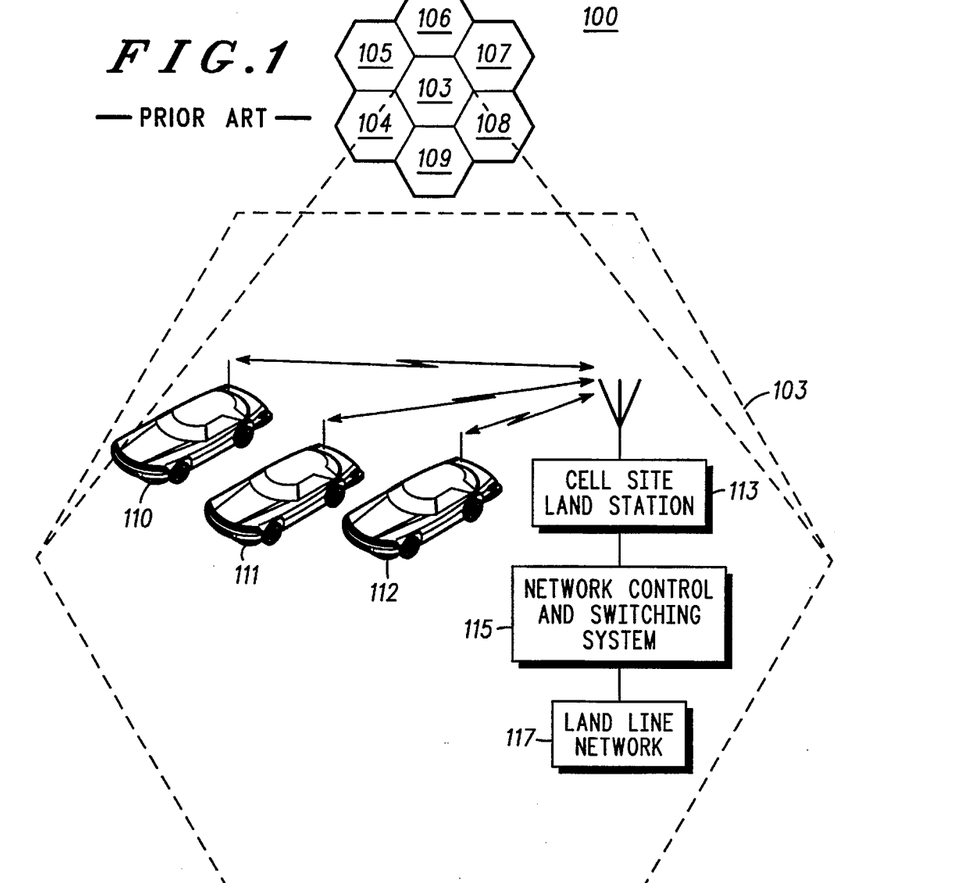
FIG. 1 is a diagram of cellular mobile subscriber units 110–112 operating in a cellular radiotelephone system.

A RF transmitting device, of which a digital cellular radiotelephone mobile subscriber unit is a convenient example, provides an appropriate setting for describing the need for the present invention. FIG. 1 is a diagram of cellular mobile subscriber units 110–112 operating in a cellular radiotelephone system 100. The cellular system 100 is designed to supply mobile telephone service using a "cellular" radio coverage plan. This plan divides a geographical area into a number of coverage areas or "cells" 103–109 with each cell being assigned a portion of the available radio channels. The channels used in one cell are again useable in spatially separated cells in the same coverage area 100.

Recommended minimum standards for the digital subscriber units 110–112 for use in the 800 MHz. Cellular operating band may be found in the Cellular System Dual-Mode Mobile Station-Base Station Compatibility Standard IS-54 (Revision A) published by the Electronic Industries Association in January 1991 which assures that the subscriber units 110–112 can obtain service in any cellular system 100 that meets the compatibility requirements of IS-54 (Revision A). For the sake of brevity, all subparagraphs (or sections) called out in this document refer to IS-54 (Revision A). Compatibility, is used in connection with IS-54 (Revision A), is understood to mean that any subscriber unit 110–112 is able to place and receive calls in any cellular system 100, and all cellular systems 100 are able to place and receive calls with any subscriber unit 110–112. To assure compatibility, it is essential that both radio system parameters and call-processing parameters be specified in the sequence of call-processing steps that the mobile and land stations execute to establish calls has been specified in IS-54 (Revision A) along with the messages and signals that are exchanged between the system provider and the subscriber units 110–112. The subscriber units 110–112 communicate with a distributed array of cell-site land stations, for example cell-site 113. The cell-site land station 113 is controlled by the cellular-system network control and switching equipment 115 that provides connection to the worldwide telecommunications network 117. A call between the land network 117 and the subscriber units 110–112 is routed via the cellular control system 115 to the cell site 113 that best serves the location of the subscriber units 110 through 112. A call in progress can proceed indefinitely as a subscriber unit 110, 111 or 112 moves from cell to cell throughout the coverage area 100 since it is automatically reassigned to an available channel with any new cell.

The transmitters in mobile subscriber units 110–112 must be capable of reducing or increasing output power on command from a cell-site land station 113 specifying eight output power levels per the aforementioned Cellular Standard IS-54 §2.1.2.2. The power level specified depends of the distance between the subscriber unit 110, 111 or 112 and the cell-site 113. For example, the output power level transmitted from subscriber units 110–112 increases as the distance between the subscriber units 110–112 and the cell-site 113 increases. However, the input power to the cell-site 113 from the subscriber units 110–112 is desired to be substantially equal regardless of the distance between the subscriber units 110–112 and the cell-site 113.

Cellular radiotelephones operating in a digital system, such as a time division multiple access (TDMA) signalling scheme described in IS-54 (Revision A), have a particular problem of generating a shaped transition between the minimum and maximum output power levels of the transmitter's power amplifier. In the TDMA system, data for one mobile subscriber unit is multiplexed in time with data for two other mobile subscriber units on the same channel. The format for a time frame of information sent by the mobile units 110–112 is described in §1.2.1. Each time frame includes two transmit, two receive and two idle time slots. Each subscriber unit 110–112 transmits a burst of information in a transmit time slot to the cell-site 113. Transmission of bursts of information by the mobile unit 110, for example, requires the mobile unit's transmitter to turn on and off at the beginning and end of each frame, respectively. In the TDMA system the maximum transition time between the on and off states of the mobile units transmitter is required to be three information symbol time periods per the aforementioned Cellular Standard IS-54 §2.1.2.1.2.

In general, reducing the transmission time between the on and off states of the transmitter increases the available time for transmission of information but has the adverse effect of increasing spectral splatter which interferes with adjacent and alternate channels assigned to other subscriber units. Adjacent and alternate channel interference specifications, −26 dbc and −45 dbc respectively, are described in the aforementioned Cellular Standard IS-54 §2.1.4.1.2. Increasing the transition time reduces the spectral splatter but shortens the available time for transmission of information. Therefore, a compromise is needed between acceptable spectral splatter and required time for data transmission. For a TDMA system, simply turning the transmitter on or off with a step function within the maximum transition time will not meet the spectral splatter requirement.

In the TDMA system, the transmitter is specified to operate over a wide dynamic range of 94.8 dB. Voltage controlled attenuators (VCA) typically used to control the magnitude of the power output signal have a dynamic range of 35 dB. Three cascaded VCAs may be used achieve a dynamic range of 105 dB thus meeting the dynamic range requirement of 94.8 dB. The problem with this approach is that additional signal processing and hardware is required to shape the transition between the on and off states using a digital signal source. Furthermore, it is advantageous to implement the VCAs on an integrated circuit (IC) but there are problems achieving the full dynamic range required due to the close proximity of cascaded VCAs on the IC.

Since the transmitter line up in a TDMA system is linear, the dynamic range of the transmitted signal may also be achieved by controlling various stages of the transmitter line up. The disadvantage of this approach is that additional control circuitry and signal processing would be required to control the shaped transition through the various stages thus increasing the cost and complexity of the transmitter.

For many situations, for which a digital cellular radiotelephone mobile subscriber unit operating in a TDMA system is merely an example, the prior art has not produced an apparatus or method of generating the transition region between the minimum and maximum output power levels of a RF power amplifier to meet the difficult requirement of minimizing spectral splatter while providing for the advantage of an economical transmitter design.

An apparatus and method of the present invention produces a shaped transition between an on and an off state of a radio frequency transmitter. The radio frequency transmitter is turned on. A data burst to be transmitted by the radio frequency transmitter is generated in response to the radio frequency transmitter being turned on. The data burst is filtered with a filter having a predetermined frequency response. The filtered data burst is amplified whereby the data burst is shaped according to the predetermined frequency response during the transition.

BRIEF DESCRIPTION OF THE DRAWINGS

Tables 1A and 1B illustrate the input data to the FIR filter of FIG. 6 having thirty two taps.

DETAILED DESCRIPTION OF A PREFERRED EMBODIMENT

Figure 2:
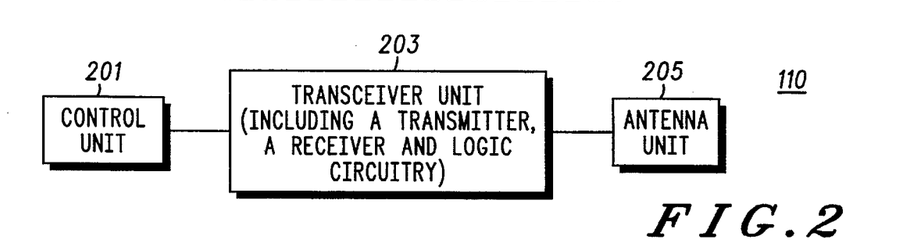
FIG. 2 is a block diagram of a subscriber unit 210 used in the cellular system of FIG. 1.

Referring now to FIG. 2, there is shown the subscriber unit 210 required for a cellular system, such as described in FIG. 1, which consists of the following units: a control unit 201, a transceiver unit 203 (including a transmitter, a receiver and logic circuitry), and an antenna unit 205. Although FIG. 2 depicts the control unit 201, the transceiver unit 203 and the antenna unit 205 as three separate units, all three may be contained within a single housing if the physical limitations permit either mounting the combined unit within reach of the vehicle operator, or using it as a hand-held "portable" unit.

The control unit 201 is the interface between the subscriber and the system. The subscriber interface requirements may include a handset; a keypad; a loudspeaker; all subscriber-unit controls; indicators; and, if provided, a digit display, with which the subscriber interacts during the process of placing or receiving a call. Portions of the control unit 201 may be mounted physically in separate packages. A microphone and loudspeaker combination or other peripherals may be used in place of the handset to provide a means of using the system without holding the handset. For example, a control unit is shown and described in Motorola instruction manual number 68P81066E40, entitled "DYNATAC Cellular Mobile Telephone 800 MHZ Transceiver," (or the portable transceiver shown and described in Motorola instruction manual number 68P81054E60, entitled "DYNATAC Cellular Portable Telephone G-Series") published by and available from Motorola C & E Parts, 1313 East Algonquin Road, Schaumburg, Ill. 60196.

The transceiver unit 203 includes a transmitter 500, a receiver and logic circuitry with a microprocessor and memory for providing duplex voice transmission and reception. The radio frequency (RF) band is divided into two separate 25 MHz wide segments each consisting of 833 channels. The first segment from 824 to 849 MHz, contains the subscriber-unit transmit channels. The second segment from 869 to 894 MHz, contains the subscriber-unit receive channels. Each subscriber-unit transmit channel is separate from its duplex receive channel by 45 MHz.

The antenna unit 205 connects to the transceiver unit 203 and consists of a vertically-polarized broad-bandwidth antenna. The antenna unit 205 radiates RF signals from the transmitter of the transceiver unit 203 or receives RF signals for the receiver of the transceiver unit 203.

Figure 3:
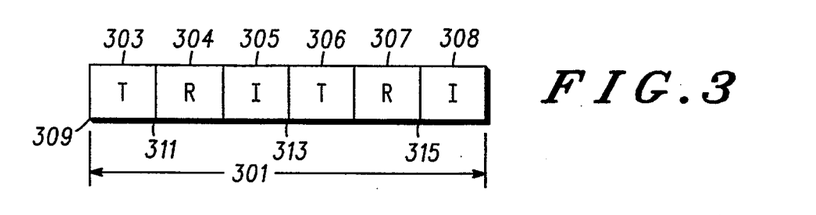
FIG. 3 illustrates the channel time frame structure including transmit, receive and idle periods for the subscriber unit of FIG. 2.

Referring now to FIG. 3, there is shown a signaling frame including transmit and receive information for the subscriber unit 110 operating in a TDMA system per §1.2. the frame shall consist of six equally sized time slots, 303–308, exactly 162 symbols in length. Two slots are designated for transmitting information, 303 and 306. Two slots are designated for receiving information, 304 and 307. Two slots are designated as an idle state, 305 and 308. In the TDMA system one frame equals 1994 bits (972 symbols) equals 40 ms or 25 frames per second. Thus, each slot equals 6.67 ms. Each full rate traffic channel utilizes two equally spaced time slots of the frame (303 and 306, 304 and 307, or 305 and 308). Each half-rate traffic channel shall utilize one time slot of the frame. Thus, the transmitter must turn on and off at the beginning 309 and 313 and end 311 and 315, respectively, of each transmitting slot 303 and 306 so as not to interfere with adjacent receive and idle time slots. The transmitter 500 employing the present invention essentially meets the spectral splatter requirement using a novel apparatus and method for generating a shaped transition between the on and off states of the transmitter.

Figure 4:
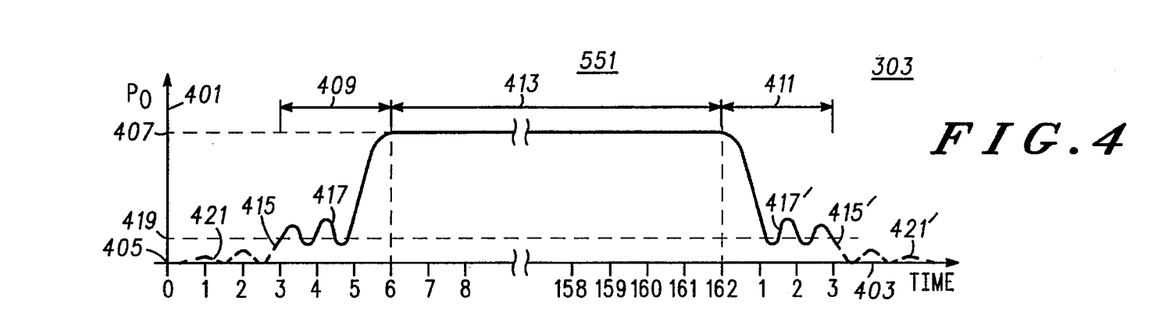
FIG. 4 illustrates a waveform of the output power level versus time for a transmit time slot (T) in the time frame illustrated in FIG. 3.

Now referring to FIG. 4, there is shown a graph of the output power level 401 of the transmitter 500 versus time 403 for the transmit time slot 303, for example. On the time axis 403, a maximum effect point (MEP) of the transmitted symbols is recorded. The MEP is defined to be the point in time at which the pulse shaping function associated with the modulation is at a maximum for the symbol of interest (refer to the aforementioned Cellular Standard IS-54 §2.1.3.3.1 for a description of the pulse shaping function). The relationship between the MEP and the associated symbol period is such that the MEP is defined to occur at the end of the symbol period.

The first MEP for a transmitted channel is at point 6. Decoding the phase change from point 6 to point 7 provides the first two bits of transmitted data. Decoding the phase change from point 161 to point 162 provides the last two bits of transmitted data. Point 0 is the same MEP as point 162 of the previous time slot.

A transition between the off state 405 and the on state 407 of the transmitter's output power level is specified to occur within three symbol periods during transition region 409 (between MEP 3 and MEP 6). Likewise, the transition between the on state 407 and the off state 405 of the transmitter's output power level is specified to occur within three symbol periods during transition region 411 (between MEP 162 and MEP 3). When the transmitter 500 is in the on state 407, 156 symbol periods or 157 MEPs are transmitted in region 413. In the preferred embodiment of the present invention, the maximum output power level, defined as the on state of the transmitter, is variable between 7.8 dBm and 34.8 dBm in 4.0 dB steps per the aforementioned Cellular Standard IS-54 §2.1.2.2 to achieve the output power levels 0–7. The minimum output power level, defined as the off state of the transmitter 500, is specified to be −60 dBm per the aforementioned Cellular Standard IS-54 §2.1.2.1.2. Thus, the transmitter 500 is specified to have a maximum dynamic range of 94.8 dB (34.8 dBm minus −60 dBm) and a minimum dynamic range of 67.8 dBm (7.8 minus −60dBm) between the off state 405 and on 407 state of the transmitter output power level. Therein lies the problem of achieving the maximum dynamic range (94.8 dB) of transmitter output power level while meeting the spectral splatter requirement.

In the the preferred embodiment of the present invention, a novel shaped transition is produced by the transmitter 500 between the off state 405 and on 407 state during predetermined three transitional symbol periods which achieves the maximum dynamic range required of the transmitter and meets the spectral splatter requirement. The novel apparatus and method generating the shaped transition between the on state 405 and off state 407 of the transmitter includes two shaped portions. The shaped transition between the off state 405 and the on state 407 includes a first shaped portion 415, a step function, occurring at the MEP 3 between the minimum output power level 405 and an intermediate power level 419. The second shaped portion 417 is a square root raised cosine (SQRC) impulse response between the intermediate output power level 419 and the maximum output power level 407. Likewise, the shaped transition between the on state 407 and the off state 405 includes a first shaped portion 417', a square root raised cosine (SQRC) impulse response, between the maximum output power level 407 and an intermediate power level 419. The second shaped portion 415', a step function occurring at MEP 3, is between the intermediate output power level 419 and the minimum output power level 405.

For the preferred embodiment of the transmitter 500, it was determined that an instantaneous power output level step, between the minimum output power level 405 and the intermediate output power level 419, to −20 dBc of the maximum output power level 407 met the spectral splatter interference specification. Therefore, the step function 415 or 415' has a maximum output power level of 14.8 dBm (34.8 dBm minus 20 dBm) resulting in a maximum dynamic range of 74.8 dB (14.8 dBm minus −60 dBm), and a minimum output power level of −12.2 dBm (7.8 dBm minus 20 dBm) resulting in a minimum dynamic range of 47.8 dBm (−12.2 dBm minus −60 dBm).

Figure 5:
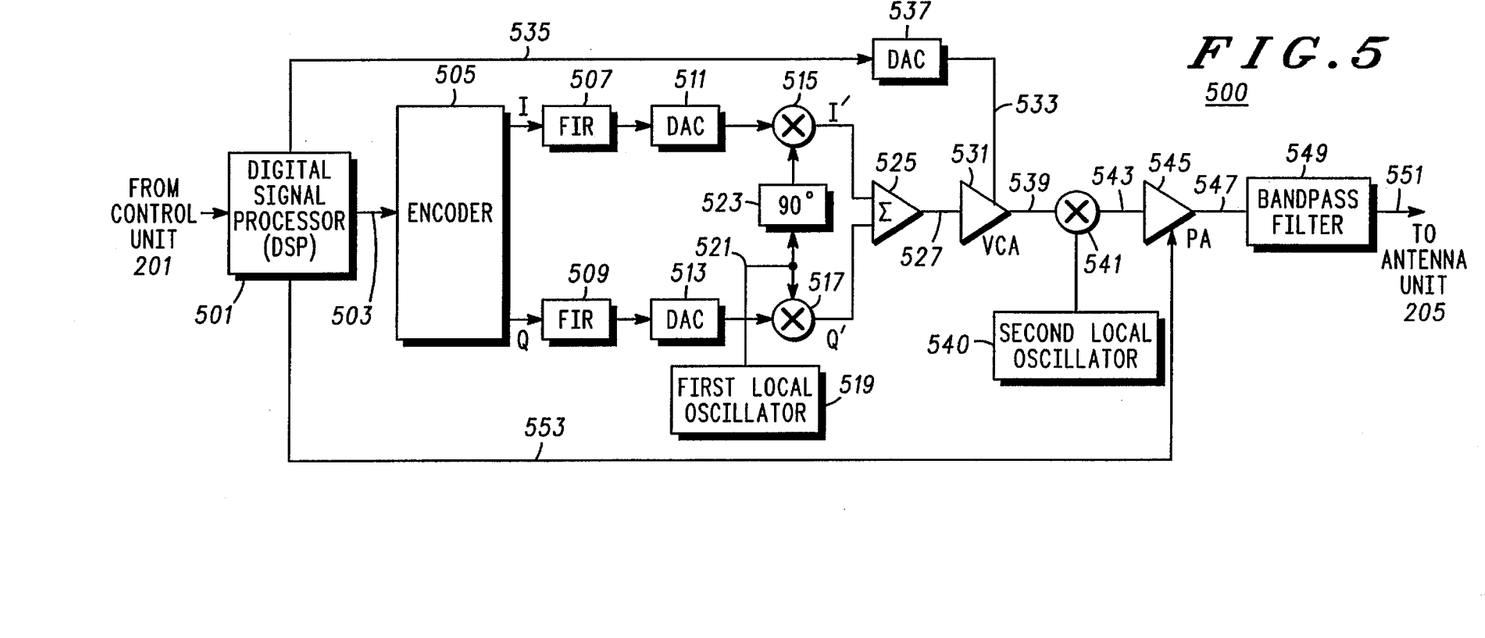
FIG. 5 is a simplified block diagram of a transmitter 500 line up used in the transceiver unit 203 of FIG. 2.

Referring now to FIG. 5, there is shown the transmitter 500 used in the transceiver unit 203. A digital signal processor (DSP) 501 processes signals from the control unit 201 and generates a corresponding serial bit stream, otherwise known as a data burst, to be transmitted within time slots 303 and/or 305 of the signaling frame illustrated in FIG. 3. An encoder 505 converts two consecutive bits of the serial bit stream signal 303 into a symbol corresponding to a position on a π/4 shifted DQPSK phase constellation represented by vectors I and Q (refer to the afore Cellular Standard IS-54 §2.1.3.3.1 for details on the bit to symbol conversion). Signal vectors I and Q are processed through finite impulse response (FIR) filters 507 and 509, respectively, to eliminate harmonic distortion generated by changing symbols. Digital to analog converters (DAC) 511 and 513 convert digitally filtered vector signals from the FIR filters 507 and 509, respectively, to analog vector signals. The analog vector signals from the DACs 511 and 513 are combined in mixers 515 and 517 with a first local oscillator frequency signal from a first local oscillator 519 of 90 MHz. The local oscillator frequency signal 521 is phase shifted by a 90 degree phase shifter 523 for mixer 515 since the vector signals I and Q are 90 degrees out of phase from one another. The output of mixers 515 and 517, I' and Q' respectively, represent analog frequency shifted vector signal components of the symbol to be transmitted. Signals I' and Q' are combined in a summer 525 so that the vector component signals I' and Q' can be transmitted on the same RF channel.

The output 527 of summer 525 represents an information symbol to be transmitted by the transmitter. The symbol 527 is then processed through a voltage control attenuator (VCA) 531 responsive to an analog voltage control line at 533. A digital voltage control at line 535 is generated by the DSP 501 is converted through a DAC 537 to produce the analog voltage control line at 533 for controlling the VCA 531. The attenuated signal 539 from the VCA is combined in mixer 541 with a second local oscillator frequency signal of 914–939 MHz from block 540 to convert the frequency of the attenuated signal 539 from 90 MHz to 824–849 MHz at line 543. A power amplifier 545 is turned on and off by a bias control signal at line 553 from the DSP 501. The power amplifier 545 amplifies the power of the frequency shifted signal 543 to produce an amplified signal at 547. The amplified signal 547 is processed through a bandpass filter 549, 25 MHz wide for example, to quiet transmit noise in other mobile receivers. The filtered signal 551 is transmitted to the antenna unit for radiation to the cell-site land station 113. The operation of the VCA 531 and the power amplifier 545 is described in more detail in the aforementioned U.S. patent application Ser. No. 07/632,231.

The transmitter 500 shown in FIG. 5 is used to transmit digital signals. The advantage of the present invention utilizes this conventional arrangement to achieve the shaped transition between the on and off states of the transmitter's output power level as described in FIG. 4 while meeting the wide dynamic range and spectral splatter requirements. In general, the data burst generated by the DSP 501 at line 503 is filtered at blocks 507 and 509 to produce the shaped transition between the on and off states of the transmitter 500. The maximum dynamic range (74.8 dB) of the step function 415 or 415', as shown in FIG. 4, is achieved using the FIR filters 507 and 509, the VCA 531 and the power amplifier 545. The VCA contributes to about 35 dB of the dynamic range. The step function 415, per FIG. 4, is generated by adjusting the VCA 531 via the control line 533, enabling the FIR filters 507 and 509, and biasing the power amplifier 545. Similarly, the step function 415' is generated by adjusting the VCA 531 via the control line 533, disabling the FIR filters 507 and 509, and unbiasing the power amplifier 545. The variable output power levels 0–7 selected by control signal levels from the cell-site 113, per FIG. 1 are achieved by adjusting the VCA 531 via the control line at 533 when the transmitter is turned on. The dynamic range of the shaped portion 417 and 417' (per FIG. 4), a minimum of 20 dB down from the maximum output power level, is achieved using the FIR filter 507 or 509. The shaped portion 417, per FIG. 4, is formed by sending data to the FIR filters at the MEP 3, per FIG. 4, such that the first information symbol may be transmitted at MEP 6, per FIG. 4. Similarly, the shaped portion 417', per FIG. 4, is formed by sending data to the FIR filters at the MEP 162, per FIG. 4, such that the last information symbol may be transmitted at MEP 3, per FIG. 4. Thus, a primary advantage of the present invention is that the full dynamic range of the transmitter's output power level and the spectral splatter requirement is achieved with minimal complexity in the transmitter 500.

The transmitter 500 of FIG. 5 illustrates the baseband data burst signal at line 503 having in-phase I and quadrature-phase Q components filtered before the modulation circuitry (comprising the mixers 515 and 517, the phase shifter 523, the summer 525 and the first local oscillator). The apparatus and method of the present invention of generating the shaped transition may also be implemented by filtering a signal modulated onto a carrier at a predetermined frequency that is generated after the modulation circuitry.

Figure 6:
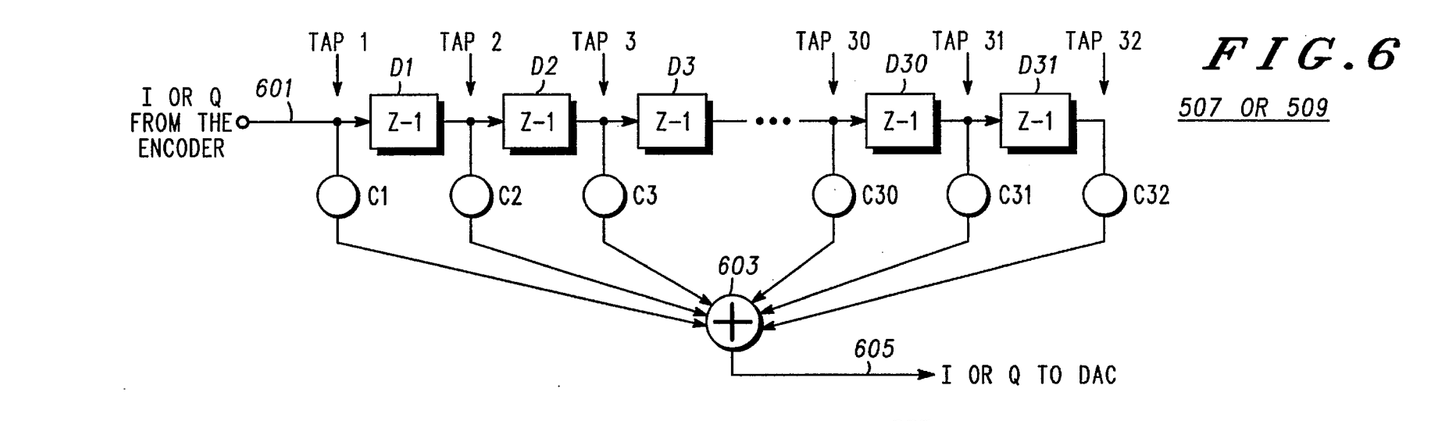
FIG. 6 is an abbreviated block diagram of a finite impulse response (FIR) filter used in the block diagram of FIG. 5.

An abbreviated conventional block diagram of the FIR filters 507 and 509 shown in FIG. 6. The FIR filter 507 or 509 has 32 taps Tap1–Tap32, delay blocks D1–D31, 32 coefficients C1–C32 and a summer 603. The vector signal I or Q from the encoder enters the FIR filter at 601 and is subsequently delayed by a predetermined unit time delay as it passes through delay blocks D1–D31. The vector signal in each tap location Tap1–Tap32 is multiplied by a corresponding coefficient C1–C32. The result of the multiplying each tap by a corresponding coefficient is added together in summer 603 to produce the filtered output signal 605 of the FIR filter 507 or 509. In the preferred embodiment of the present invention, FIR filters 507 and 509 were chosen to have 32 taps for achieving the requirements of adjacent and alternate channel interference performance per the aforementioned Cellular Standard IS-54 §2.1.4.1.2 and error vector magnitude performance per the aforementioned Cellular Standard IS-54 §2.1.3.3.1.3.3. The transmitter 500 samples each symbol from the encoder 505 of FIG. 5 four times. This sampling rate is implemented by entering the vector signal I or Q, representing a component of the symbol, followed by three zeros into the FIR 507 or 509, respectively. Thus, the FIR filter may contain at most eight symbols among the thirty two taps (eight samples plus twenty four interspersed zeros).

The FIR filters 507 and 509 have linear phase and square root raised cosine (SQRC) impulse response per §2.1.3.3.1. This is produced by the impulse response shown in FIG. 7. The SQRC impulse response is illustrated on a graph having signal magnitude represented on axis 702 and time represented on axis 701. Sampled magnitude vectors C'1–C'32 of FIG. 7 correspond to the coefficients C1–C32 of FIG. 6. C'17 is designated as the MEP for the SQRC impulse response. As previously described with FIG. 4, the MEP is defined to be the point in time at which the pulse shaping function associated with the modulation is at a maximum for the symbol of interest. In the preferred embodiment of the present invention, MEP 16 and MEP 17 are on each side of the maximum point of the response so sampled magnitude vector C'17 is designated the MEP of the SQRC impulse response. Four vector magnitude samples in time, for example C'1–C'4, characterize one symbol time for signal component I or Q of FIG. 5. Thus, the SQRC impulse response represents eight symbols each sampled four times such that four symbols are sampled on each side of the MEP at C' 17.

Figure 7:
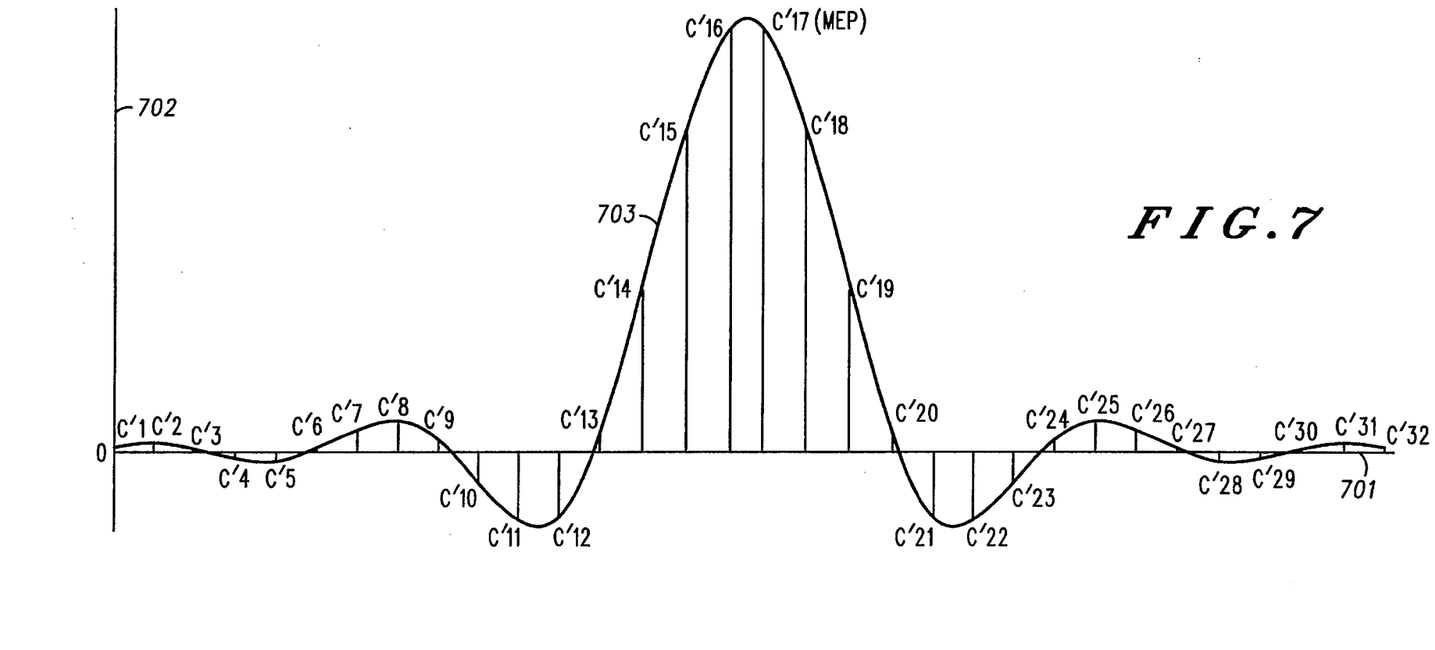
FIG. 7 is a graph representing magnitude versus time for a square root raised cosine finite impulse response for the FIR filter of FIG. 6.

The eight symbols sampled four times each representing the impulse response of FIG. 7 also fills the thirty two tap FIR filter 507 or 509 of FIG. 6. One may perceive how the four sampled symbols represented by magnitude vectors C'1–C'16 in FIG. 7, having sequentially increasing magnitudes, processed through the FIR filters 507 and 509 of FIG. 5, produces the shaped transition 417 of FIG. 4. In the preferred embodiment of the present invention, the MEP at C'17 of the SQRC impulse response aligns in time with the MEP 6 of FIG. 4. Since the SQRC impulse response of FIG. 7 has four symbols to the left of the MEP at C'17 the first symbol is entered into the FIR filter 507 or 509 at MEP 2 (MEP 6 minus MEP 2 equals four symbols) of FIG. 4. Likewise, one may perceive how the four sampled symbols represented by magnitude vectors C'17–C'32 in FIG. 7, having sequentially decreasing magnitudes, processed through the FIR filters 507 and 509 of FIG. 5, produces the shaped transition 417' of FIG. 4. In the preferred embodiment of the present invention, the MEP at C'17 of the SQRC impulse response aligns in time with the MEP 162 of FIG. 4. Since the SQRC impulse response of FIG. 7 has four symbols to the right of the MEP at C'17, zeros are entered into the FIR filter 507 or 509 at MEP 158 (MEP 162 minus MEP 158 equals four symbols) of FIG. 4. Since the corresponding magnitude of the vectors C'29–C'32 of the last symbol is very small, the vectors are truncated from the impulse response of the shaped portion 417' of FIG. 4. Truncating the last of the four symbols does not substantially affect the spectral splatter requirement and is not needed for the shaped transition 417' since the transition region 411 has a duration of only three symbols.

Tables 1A and 1B, combined, illustrate the I or Q sampled symbols entered to the FIR filter 507 or 509, respectively. Only the beginning Table 1A and the end Table 1B of the table are shown to illustrate data processed through the FIR filters during the transition regions. The sampled symbols, processed through the FIR filter at the appropriate time, generates the shaped transition 417 during time period 409 when turning the transmitter on and the shaped transition 417' during the time period 411 when turning the transmitter off. Tables 1A and 1B have 32 taps corresponding to the 32 taps of the FIR filter 507 or 509. Each symbol is entered into the FIR filter followed by three zeros.

Table 1A describes the symbols, for example "a", "b", "c", "d" and "e", entered in the FIR filters 507 and 509 during the transition from the off state to the on state of the transmitter to generate the shaped transition 417 of FIG. 4. Before the first symbol is entered, the power amplifier 545 of FIG. 5 is biased off via bias control signal at line 553 and the VCA 531 is adjusted to maximum attenuation via control signal at line 533. The FIR filters 507 and 509 of FIG. 5 are also turned off by setting the coefficients C1–C32 per FIG. 6 to zero. As previously mentioned with FIG. 7, the first symbol "a" is entered into the FIR filter 507 or 509 in Tap1 at MEP 2 per FIG. 4. The second, third and fourth samples of the first symbol "a" corresponding to the MEP 2 is entered into the FIR filter at taps 1, 2, and 3 as zeros moving symbol "a" to Tap 4. The next symbol entered into the FIR filter is symbol "b" at the MEP 3 per FIG. 4 in tap 1. The MEP 3 is the beginning of the transition region between the off state 405 and on state 407 of the transmit output power level. At the MEP 3, the VCA 531 is adjusted by the control signal at line 533 per FIG. 5 corresponding to the output power level requested via control signal levels from the cell-site 113 of FIG. 1, and the power amplifier 545 is biased on by bias control signal at line 553 per FIG. 5. The FIR filters 507 and 509 are also turned on by setting the coefficients C1–C32 per FIG. 6 to their corresponding magnitude vector C'1–C'32 of FIG. 7. Adjusting the VCA 531 and biasing the power amplifier 545 allow nonlinearities and inefficiencies in the transmitter line up circuitry of FIG. 5 to generate the step function 415 of FIG. 4 from the minimum power level 405 to an intermediate power level 419 per FIG. 4. The step function 415 constitutes the first novel portion of the shaped transition region 409 between the on and off states of the transmitter 500. It has been empirically determined that the step function 415 will not result in spectral splatter violating adjacent and alternate channel interference requirements. Also at the MEP 3, the FIR filters are turned on by enabling the coefficients C1–C32 of the FIR filters 507 and 509 as determined by the vector magnitude C'1–C'32 of the impulse response of the FIR filters per FIG. 7. The shaped transition 417 of FIG. 4, between the intermediate power level 419 and the maximum output power level 407, is generated by processing symbols "a", "b" and "c" and "d" through the active FIR filters 507 or 509. Symbols "a", "b" and "c" are shifted through the FIR filters 507 and 509 by sequentially entering the additional symbols into the FIR filters 507 or 509. At the MEP 6 as shown in FIG. 4, the transmit output power level is at its maximum 407 and the symbols may be transmitted. The MEP 6 corresponds in time with the MEP of the SQRC impulse response C'17 of FIG. 7 when the first symbol "a" is in Tap17 of the FIR filter 507 or 509. Thus, processing symbols through the FIR filters 507 and 509 at a predetermined time before the first symbol is transmitted generates the shaped transition 417, corresponding to the impulse response of the FIR filters per FIG. 7, in the region 409 between the off state 405 and the on state 407 of the transmitter 500.

Table 1B describes the symbols "s" through "z" entered into the FIR filters 507 or 509 during the transition from the on state 407 to the off state 405 of the transmitter 500. The beginning of the ramp down transition occurs at MEP 162 as shown in FIG. 4. Since the FIR filters can hold eight samples at a time, zeros are entered into the FIR filter at MEP 158 as described with FIG. 6. The coefficients C1–C32 of the FIR filter of FIG. 7 corresponding to magnitude vectors C'1–C'32 of the SQRC impulse response of FIG. 7 are multiplied by Tap 1–Tap 32 as the sampled symbols are entered into the FIR filters, respectively, until the MEP 3 at the end of the ramp down portion 411 of FIG. 4 is reached. At MEP 162 of FIG. 4, Tap 17 corresponding to the magnitude vector C'17 of FIG. 7, the shaped transition 417' from the maximum output power level 407 and the intermediate output power level 419 begins. As the samples are processed through the FIR filters 507 or 509, the SQRC impulse response generates the shaped transition 417'. At the MEP 3, the step function 415' from the intermediate output power level 419 to the minimum output power level 405 is generated by adjusting the VCA 531 to a minimum output power level via control signal at line 533 and biasing off the power amplifier 545 via bias control signal at line 553. Since the magnitude vectors C'29–C'32 of the last symbol "z" are very small, their value is truncated from the filtered response by adjusting the VCA 531 to its minimum power level and biasing off the PA 545 before the last symbol "z" has filtered through the FIR filter 507 or 509 of FIG. 5. Thus, processing symbols through the FIR filters 507 or 509 for a predetermined time after the last symbol is transmitted generates the shaped transition 417', corresponding to the impulse response of the FIR filters, in the region 411 between the on state 407 and the off state 405 of the transmitter 500.

Figure 8:
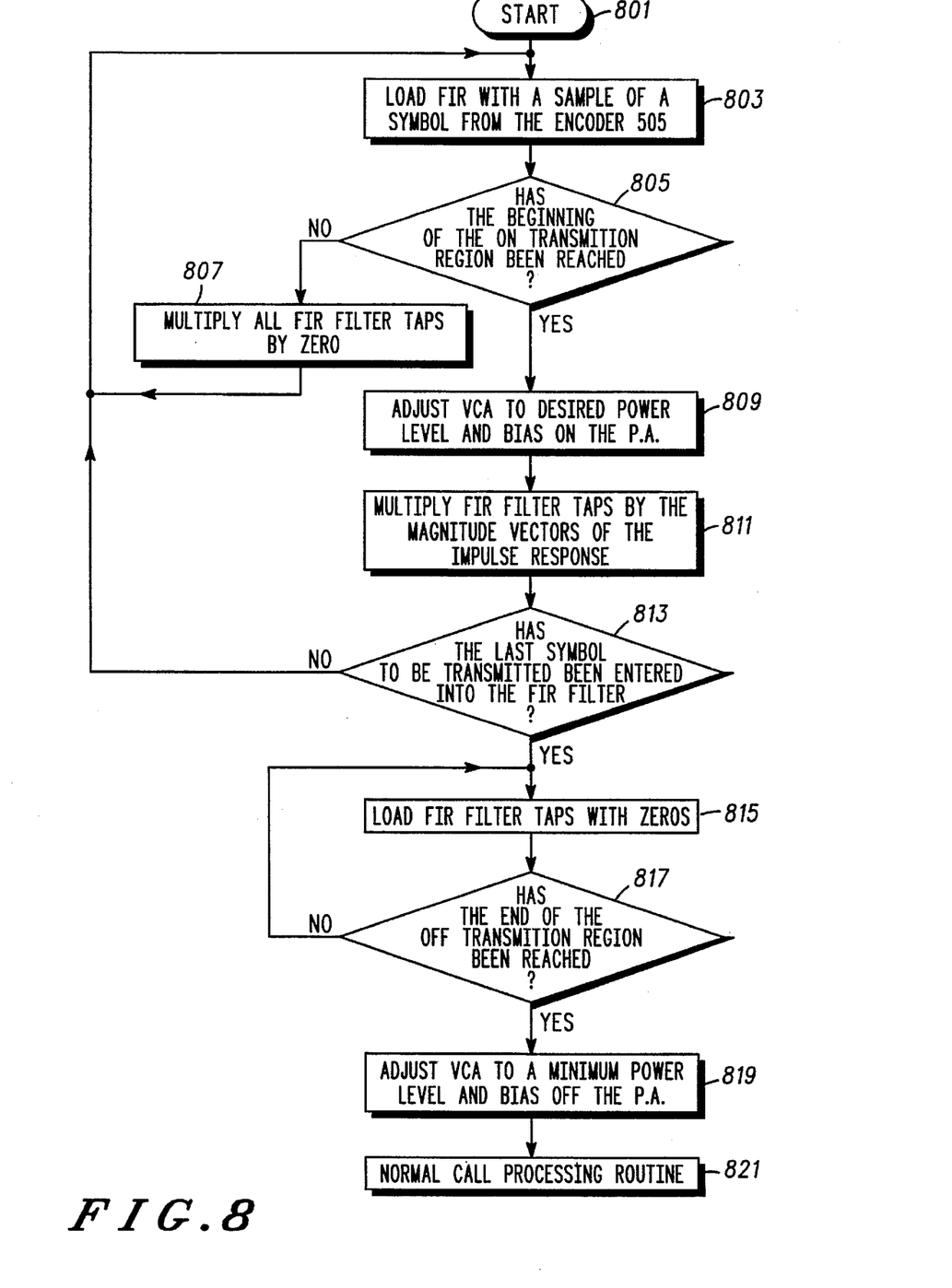
FIG. 8 is a flow chart describing the process used by digital signal processor 501 to generate the shaped transition between the minimum and maximum power levels of the waveform illustrated in FIG. 8.

FIG. 8 is a flow chart carried out by the DSP 501 to implement the process of the present invention. The process begins at block 801 whereafter a sample is loaded from the encoder 505 into the FIR filter 507 or 509 per FIG. 5 at block 803. A determination is made at block 805 if the beginning of the on state transition region 409 has been reached. At this point in time the fifth tap location of the FIR filter contains a MEP sample. Tap 5 corresponds to the first symbol "a" in FIG. 8 aligned in time with MEP 3 of FIG. 4. So the transition between the on state and the off state of the transmitter 500 may begin. If the determination is negative, all taps are multiplied by zero at block 807 and another sample is loaded from the encoder 505 into the FIR filter 507 or 509 at block 803. If a positive determination is made at block 805, the VCA 531 is adjusted to meet the output power level requirement determined by the cell-site 113 of FIG. 1 and the power amplifier is biased on at block 809 to step the transmitter 500 from the off state 405 to the intermediate output power level 419 of FIG. 4. At block 811 the Tap1–Tap32 of the FIR filter 507 and 509 are multiplied by coefficients C1–C32, respectively, per FIG. 6. The coefficients C1–C32 correspond to the magnitude vectors C'1–C'32 of the impulse response of each sampled symbol. A determination is made at block 813 if the last symbol to be transmitted has been entered into the FIR filter 507 or 509. If the determination is negative, another sample of a symbol is loaded from the encoder into the FIR filter at 803. If the determination is positive, the input to the FIR filter is loaded with a zero at block 915. As previously described with FIG. 7 and FIG. 8, the last four symbols transmitted are used to generate the shaped transition 417' when the transmitter 500 is turning off. Thus, during the generation of the shaped transition 417', the entered zeros behind the last symbol prevent information symbols from being transmitted. A determination is then made at block 817 if the end of the off state transition region 411 has been reached. This occurs at MEP 3 which is three symbol time periods past the last transmitted symbol at MEP 162 as described in FIG. 4. If the determination is negative the process continues to load zeros into the input of the FIR filter 507 or 509 at block 815. If the determination is positive at block 917, the control signal at line 533 adjusts the VCA 531 a minimum output power level and the power amplifier is biased off at block 819 to produce the step function 415' between the intermediate output power level at 419 and the off state at 405 as shown in FIG. 4. The flow then continues to block 821 to initiate normal call processing routines.

While the transmitter 500 utilizes a stepped transition incombination with a shaped transition to complete the transition between the on and off states of the transmitter, a shaped transition may be used to complete the transition without utilizing the stepped transition shown as waveshapes 421 and 421' in FIG. 4.

TABLE 1

| SYMBOL# | FIR TAP | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | PWR. AMP. | VCA | FIR Filter Coeficients |
|---|---|---|---|---|---|---|---|---|---|---|---|---|---|---|---|---|---|---|---|---|---|---|---|---|---|---|---|---|---|---|---|---|---|---|---|---|
| RAMP UP | | | | | | | | | | | | | | | | | | | | | | | | | | | | | | | | | | | | | |
| 2 | SAMPLE# 1 | a | | | | | | | | | | | | | | | | | | | | | | | | | | | | | | | | Biased off | Off | 0 |
| " | " 2 | | a | | | | | | | | | | | | | | | | | | | | | | | | | | | | | | | " | " | 0 |
| " | " 3 | | | a | | | | | | | | | | | | | | | | | | | | | | | | | | | | | | " | " | 0 |
| " | " 4 | | | | a | | | | | | | | | | | | | | | | | | | | | | | | | | | | | " | " | 0 |
| 3 | " 1 | b | | | | a | | | | | | | | | | | | | | | | | | | | | | | | | | | | Biased on | On | Per. imp. response |
| " | " 2 | | b | | | | a | | | | | | | | | | | | | | | | | | | | | | | | | | | " | " | " |
| " | " 3 | | | b | | | | a | | | | | | | | | | | | | | | | | | | | | | | | | | " | " | " |
| " | " 4 | | | | b | | | | a | | | | | | | | | | | | | | | | | | | | | | | | | " | " | " |
| 4 | " 1 | c | | | | b | | | | a | | | | | | | | | | | | | | | | | | | | | | | | " | " | " |
| " | " 2 | | c | | | | b | | | | a | | | | | | | | | | | | | | | | | | | | | | | " | " | " |
| " | " 3 | | | c | | | | b | | | | a | | | | | | | | | | | | | | | | | | | | | | " | " | " |
| " | " 4 | | | | c | | | | b | | | | a | | | | | | | | | | | | | | | | | | | | | " | " | " |
| 5 | " 1 | d | | | | c | | | | b | | | | a | | | | | | | | | | | | | | | | | | | | " | " | " |
| " | " 2 | | d | | | | c | | | | b | | | | a | | | | | | | | | | | | | | | | | | | " | " | " |
| " | " 3 | | | d | | | | c | | | | b | | | | a | | | | | | | | | | | | | | | | | | " | " | " |
| " | " 4 | | | | d | | | | c | | | | b | | | | a | | | | | | | | | | | | | | | | | " | " | " |
| 6 | " 1 | e | | | | d | | | | c | | | | b | | | | a | | | | | | | | | | | | | | | | " | " | " |
| . | . | | | | | | | | | | | | | | | | | | . | . | | | | | | | | | | | | | | " | " | " |
| RAMP DOWN | | | | | | | | | | | | | | | | | | | | | | | | | | | | | | | | | | | | |
| 158 | SAMPLE# 1 | z | | | | y | | | | x | | | | w | | | | v | | | | u | | | | t | | | | s | | | | " | " | " |
| " | " 2 | | z | | | | y | | | | x | | | | w | | | | v | | | | u | | | | t | | | | s | | | " | " | " |
| " | " 3 | | | z | | | | y | | | | x | | | | w | | | | v | | | | u | | | | t | | | | s | | " | " | " |
| " | " 4 | | | | z | | | | y | | | | x | | | | w | | | | v | | | | u | | | | t | | | | s | " | " | " |
| 159 | " 1 | | | | | z | | | | y | | | | x | | | | w | | | | v | | | | u | | | | t | | | | " | " | " |
| " | " 2 | | z | | | | y | | | | x | | | | w | | | | v | | | | u | | | | t | | | | | | | " | " | " |
| " | " 3 | | | z | | | | y | | | | x | | | | w | | | | v | | | | u | | | | t | | | | | | " | " | " |
| " | " 4 | | | | z | | | | y | | | | x | | | | w | | | | v | | | | u | | | | t | | | | | " | " | " |
| 160 | " 1 | | | | | z | | | | y | | | | x | | | | w | | | | v | | | | u | | | | | | | | " | " | " |
| " | " 2 | | z | | | | y | | | | x | | | | w | | | | v | | | | u | | | | | | | | | | | " | " | " |
| " | " 3 | | | z | | | | y | | | | x | | | | w | | | | v | | | | u | | | | | | | | | | " | " | " |
| " | " 4 | | | | z | | | | y | | | | x | | | | w | | | | v | | | | u | | | | | | | | | " | " | " |
| 161 | " 1 | | | | | z | | | | y | | | | x | | | | w | | | | v | | | | | | | | | | | | " | " | " |
| " | " 2 | | z | | | | y | | | | x | | | | w | | | | v | | | | | | | | | | | | | | | " | " | " |
| " | " 3 | | | z | | | | y | | | | x | | | | w | | | | v | | | | | | | | | | | | | | " | " | " |
| " | " 4 | | | | z | | | | y | | | | x | | | | w | | | | v | | | | | | | | | | | | | " | " | " |
| 162 | " 1 | | | | | z | | | | y | | | | x | | | | w | | | | | | | | | | | | | | | | " | " | " |
| " | " 2 | | z | | | | y | | | | x | | | | w | | | | | | | | | | | | | | | | | | " | " | " |
| " | " 3 | | | z | | | | y | | | | x | | | | w | | | | | | | | | | | | | | | | | " | " | " |
| " | " 4 | | | | z | | | | y | | | | x | | | | w | | | | | | | | | | | | | | | | " | " | " |
| 1 | " 1 | | | | | z | | | | y | | | | x | | | | | | | | | | | | | | | | | | | | " | " | " |
| " | " 2 | | z | | | | y | | | | x | | | | | | | | | | | | | | | | | | | | | | " | " | " |
| " | " 3 | | | z | | | | y | | | | x | | | | | | | | | | | | | | | | | | | | | " | " | " |
| " | " 4 | | | | z | | | | y | | | | x | | | | | | | | | | | | | | | | | | | | | " | " | " |

TABLE 1-continued

| SYMBOL # | FIR TAP | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | PWR. AMP. | VCA | FIR Filter Coeficients |
|---|---|---|---|---|---|---|---|---|---|---|---|---|---|---|---|---|---|---|---|---|---|---|---|---|---|---|---|---|---|---|---|---|---|---|---|---|
| 2 | 1 | | | | | | | | | | | | | | | | | | | | | | | | | z | | | | y | | | | " | " | " |
| " | 2 | | | | | | | | | | | | | | | | | | | | | | | | | | z | | | | y | | | " | " | " |
| " | 3 | | | | | | | | | | | | | | | | | | | | | | | | | | | z | | | | y | | " | " | " |
| " | 4 | | | | | | | | | | | | | | | | | | | | | | | | | | | | z | | | | y | Biased off | Off | 0 |
| 3 | 1 | | | | | | | | | | | | | | | | | | | | | | | | | | | | | z | | | | " | " | 0 |
| " | 2 | | | | | | | | | | | | | | | | | | | | | | | | | | | | | | z | | | " | " | 0 |
| " | 3 | | | | | | | | | | | | | | | | | | | | | | | | | | | | | | | z | | " | " | 0 |
| " | 4 | | | | | | | | | | | | | | | | | | | | | | | | | | | | | | | | z | " | " | 0 |

We claim:

1. A method for generating a digital burst signal in a transmitter, the digital burst signal defining a predetermined time duration including a first, a second and a third time period, the first time period providing a first transition time during which the transmitter is permitted to adjust between first and second output power levels, the second time period providing a transmission time during which the transmitter is permitted to transmit a predetermined number of sequential symbols at the transmitter's second output power level, the third time period providing a second transition time during which the transmitter is permitted to adjust between the second and first output power levels, the method comprising the steps of:

generating a first set of predetermined number of sequential symbols, which are sequentially followed by a second set of predetermined number of sequential symbols, which are sequentially followed by a third set of predetermined number of sequential symbols, wherein each of predetermined number of sequential symbols in the first and third sets of predetermined number of sequential symbols have a zero value;

filtering the generated predetermined number of sequential symbols responsive to a predetermined impulse response having a leading portion and a trailing portion; and controlling the timing of when the first, second and third sets of predetermined number of sequential symbols are generated by the step of generating responsive to the predetermined impulse response, wherein the first set of predetermined number of sequential symbols sequentially followed by the second set of predetermined number of sequential symbols are generated at a predetermined time for loading into predetermined taps forming the leading portion of the predetermined impulse response to cause the transmitter to adjust between the first and second output power levels only during the first transition time and wherein the second set of predetermined number of sequential symbols sequentially followed by the third set of predetermined number of sequential symbols are generated at a predetermined time for loading into predetermined taps forming the trailing portion of the predetermined impulse to cause the transmitter to adjust between the second and the first output power levels only during the second transition time.

2. A method according to claim 1 further comprising a step of biasing "on" the transmitter at a beginning of the first time period and "off" the transmitter at an end of the second time period.

3. A method according to claim 1 wherein the first and second output power levels further comprise "off" and "on" states, respectively, of the transmitter.

4. A method according to claim 1 wherein the first and second output power levels further comprise fixed and variable output power levels, respectively.

5. A method according to claim 1 further comprising a step of modulating either the generated predetermined number of sequential symbols or the filtered predetermined number of sequential symbols.

6. A digital burst signal transmitter, the digital burst signal defining a predetermined time duration including a first, a second and a third time period, the first time period providing a first transition time during which the transmitter is permitted to adjust between first and second output power levels, the second time period providing a transmission time during which the transmitter is permitted to transmit a predetermined number of sequential symbols at the transmitter's second output power level, the third time period providing a second transition time during which the transmitter is permitted to adjust between the second and first output power levels, the digital burst signal transmitter comprising:

a signal generator for generating a first set of predetermined number of sequential symbols, which are sequentially followed by a second set of predetermined number of sequential symbols, which are sequentially followed by a third set of predetermined number of sequential symbols, wherein each of predetermined number of sequential symbols in the first and third sets of predetermined number of sequential symbols have a zero value;

a filter for filtering the generated predetermined number of sequential symbols responsive to a predetermined impulse response having a leading portion and a trailing portion; and a controller for controlling the timing of when the first, second and third sets of predetermined number of sequential symbols are generated by the step of generating responsive to the predetermined impulse response, wherein the first set of predetermined number of sequential symbols sequentially followed by the second set of predetermined number of sequential symbols are generated at a predetermined time for loading into predetermined taps forming the leading portion of the predetermined impulse response to cause the transmitter to adjust between the first and second output power levels only during the first transition time and wherein the second set of predetermined number of sequential symbols sequentially followed by the third set of predetermined number of sequential symbols are generated at a predetermined time for loading into predetermined taps forming the trailing portion of the predetermined impulse to cause the transmitter to adjust between the second and the first output power levels only during the second transition time.

7. An apparatus according to claim 6 further comprising a processor for biasing "on" the transmitter at a beginning of the first time period and "off" the transmitter at an end of the second time period.

8. An apparatus according to claim 6 wherein the first and second output power levels further comprise "off" and "on" states, respectively, of the transmitter.

9. An apparatus according to claim 6 wherein the first and second output power levels further comprise fixed and variable output power levels, respectively.

10. An apparatus according to claim 6 further comprising a modulator for modulating either the generated predetermined number of sequential symbols or the filtered predetermined number of sequential symbols.

11. A method for operating a radiotelephone in a time division multiple access system, comprising the steps of:

receiving a first digital burst signal during a first time slot of a signaling frame; and transmitting a second digital burst signal during a second time slot of the signaling frame, the second digital burst signal defining a predetermined time duration including a first, a second and a third time period, the first time period providing a first transition time during which the transmitter is permitted to adjust between first and second output power levels, the second time period providing a transmission time during which the transmitter is permitted to transmit a predetermined number of sequential symbols at the transmitter's second output power level, the third time period providing a second transition time during which the transmitter is permitted to adjust between the second and first output power levels, the method of transmitting further comprising the steps of:

generating a first set of predetermined number of sequential symbols, which are sequentially followed by a second set of predetermined number of sequential symbols, which are sequentially followed by a third set of predetermined number of sequential symbols, wherein each of predetermined number of sequential symbols in the first and third sets of predetermined number of sequential symbols have a zero value;

filtering the generated predetermined number of sequential symbols responsive to a predetermined impulse response having a leading portion and a trailing portion; and controlling the timing of when the first, second and third sets of predetermined number of sequential symbols are generated by the step of generating responsive to the predetermined impulse response, wherein the first set of predetermined number of sequential symbols sequentially followed by the second set of predetermined number of sequential symbols are generated at a predetermined time for loading into predetermined taps forming the leading portion of the predetermined impulse response to cause the transmitter to adjust between the first and second output power levels only during the first transition time and wherein the second set of predetermined number of sequential symbols sequentially followed by the third set of predetermined number of sequential symbols are generated at a predetermined time for loading into predetermined taps forming the trailing portion of the predetermined impulse to cause the transmitter to adjust between the second and the first output power levels only during the second transition time.

12. A radiotelephone for use in a time division multiple access system, comprising:

a receiver for receiving a first digital burst signal during a first time slot of a signaling frame; and a transmitter for transmitting a second digital burst signal during a second time slot of the signaling frame, the second digital burst signal defining a predetermined time duration including a first, a second and a third time period, the first time period providing a first transition time during which the transmitter is permitted to adjust between first and second output power levels, the second time period providing a transmission time during which the transmitter is permitted to transmit a predetermined number of sequential symbols at the transmitter's second output power level, the third time period providing a second transition time during which the transmitter is permitted to adjust between the second and first output power levels, the means for transmitting further comprising:

a signal generator for generating a first set of predetermined number of sequential symbols, which are sequentially followed by a second set of predetermined number of sequential symbols, which are sequentially followed by a third set of predetermined number of sequential symbols, wherein each of predetermined number of sequential symbols in the first and third sets of predetermined number of sequential symbols have a zero value;

a filter for filtering the generated predetermined number of sequential symbols responsive to a predetermined impulse response having a leading portion and a trailing portion; and a controller for controlling the timing of when the first, second and third sets of predetermined number of sequential symbols are generated by the step of generating responsive to the predetermined impulse response, wherein the first set of predetermined number of sequential symbols sequentially followed by the second set of predetermined number of sequential symbols are generated at a predetermined time for loading into predetermined taps forming the leading portion of the predetermined impulse response to cause the transmitter to adjust between the first and second output power levels only during the first transition time and wherein the second set of predetermined number of sequential symbols sequentially followed by the third set of predetermined number of sequential symbols are generated at a predetermined time for loading into predetermined taps forming the trailing portion of the predetermined impulse to cause the transmitter to adjust between the second and the first output power levels only during the second transition time.

\* \* \* \* \*